United States Patent
Banno (10) Patent No.: US 9,042,415 B2
(45) Date of Patent: May 26, 2015

(54) METHOD TO TUNE EMISSION WAVELENGTH OF SEMICONDUCTOR LASER DIODE

(71) Applicant: Sumitomo Electric Industries, Ltd., Osaka-shi (JP)

(72) Inventor: Eiichi Banno, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/920,424

(22) Filed: Jun. 18, 2013

(65) Prior Publication Data
US 2013/0343411 A1    Dec. 26, 2013

(30) Foreign Application Priority Data
Jun. 20, 2012    (JP) ................................. 2012-138895

(51) Int. Cl.
| | | |
|---|---|---|
| H01S 3/10 | (2006.01) | |
| H01S 5/06 | (2006.01) | |
| H01S 5/0687 | (2006.01) | |
| H01S 5/026 | (2006.01) | |
| H01S 5/0625 | (2006.01) | |
| H01S 5/12 | (2006.01) | |

(52) U.S. Cl.
CPC ................ *H01S 5/06* (2013.01); *H01S 5/0265* (2013.01); *H01S 5/0612* (2013.01); *H01S 5/06256* (2013.01); *H01S 5/0687* (2013.01); *H01S 5/1212* (2013.01)

(58) Field of Classification Search
CPC . H01S 3/0078; H01S 3/08027; H01S 3/0941; H01S 3/1028; H01S 3/1062; H01S 3/1317; H01S 3/04; H01S 3/0405
USPC .................................... 372/20, 28, 32, 34, 36
See application file for complete search history.

(56) References Cited

U.S. PATENT DOCUMENTS

2011/0158643 A1*  6/2011  Yamazaki ........................ 398/38

FOREIGN PATENT DOCUMENTS

| JP | 2002-374033 A | 12/2002 |
|---|---|---|
| JP | 2006-216860 A | 8/2006 |

* cited by examiner

*Primary Examiner* — Dung Nguyen
(74) *Attorney, Agent, or Firm* — Venable LLP; Michael A. Sartori; F. Brock Riggs (57) ABSTRACT

A method to tune an emission wavelength of a laser diode (LD) finely is disclosed. The method first controls a temperature of the etalon filter in T1 or T2, where the transmittance of the etalon filter becomes 40 to 50%, assuming a height between the peak and the bottom of the periodic transmittance to be 100%, at the grid wavelength $\lambda 1$ or $\lambda 2$, respectively. Then, the temperature of the LD is adjusted such that the intensity of light emitted from the LD and transmitted through the etalon filter becomes 40 to 50%.

7 Claims, 6 Drawing Sheets

METHOD TO TUNE EMISSION WAVELENGTH OF SEMICONDUCTOR LASER DIODE

BACKGROUND OF THE INVENTION

1. Field of the Invention

The present application related to a method to tune an emission wavelength of a semiconductor laser diode (hereafter denoted as LD).

2. Related Background Arts

It is known that an LD may tune an emission wavelength by being combined with an etalon filter. Because an etalon filter has a periodic transmission spectrum, an apparatus of an LD with an etalon filter detects an intensity of light emitted from the LD and transmitted through the etalon filter. The emission wavelength of the LD is tuned by feeding the detected intensity back to a temperature of the LD. This method may tune the emission wavelength of the LD with an extreme accuracy.

A Japanese patent application published as JP-2002-374033A has disclosed an optical signal source having variable emission wavelength. Another Japanese patent published as JP-2006-216860A has disclosed an apparatus to control an emission wavelength in a range shorter than a period of transmission spectrum of an etalon filter.

SUMMARY OF THE INVENTION

The method to tune the emission wavelength of a wavelength tunable LD by using an etalon filter according to an embodiment of the present application includes steps of: setting the etalon filter in a preset temperature such that the etalon filter shows a target transmittance greater than a reference transmittance, and setting the wavelength tunable LD in a target temperature such light light practically emitted from the tunable LD and transmitted through the etalon filter shows the target transmittance. For the reference transmittance, the periodic transmission spectrum of the etalon filter shows a span between wavelengths showing the reference transmittance substantially equal to a span between the grid wavelengths neighbor to each other, which is typically 28% relative to the height between the peak and the bottom of the transmission spectrum.

BRIEF DESCRIPTION OF THE DRAWINGS

The invention will be described in conjunction with the accompanying drawings, in which.

DETAILED DESCRIPTION OF PREFERRED EMBODIMENTS

Next, a method to tune an emission wavelength of an LD according to an embodiment of the invention will be described in detail as referring to accompanying drawings. In the description of the drawings, numerals or symbols same with or similar to each other will refer to elements same with or similar to each other without overlapping explanations.

First, a comparable embodiment is described. A wavelength tunable LD combined with an etalon filter has been well known. Light emitted from an LD and transmitted through the etalon filter is detected to tune the emission wavelength of the LD, because the etalon filter inherently has a periodic transmission spectrum. Feeding the detected result back to a temperature of the LD, the emission wavelength of the LD is precisely aligned with one of grid wavelengths each having a constant span to a neighbor grid wavelength.

The system described above may shift the emission wavelength of the LD from the grid wavelength, which we call the fine tuning. Specifically, the emission wavelength may be adjusted in ±7 GHz around the grid wavelength, where each of the grid wavelengths is apart from the neighbor one by 50 GHz, by varying a temperature of the etalon filter. The periodic transmission spectrum of the etalon filter depends on a temperature thereof. Accordingly, the emission wavelength of the LD may be adjusted by varying the temperature of the etalon filter. Such a system to tune the emission wavelength finely provides two thermo-electric coolers (hereafter denoted as TEC).

However, an etalon filter generally has a large heat capacity compared with an LD, and it takes a relatively longer time to change the temperature of the etalon filter. Also, the temperature dependence of the transmission spectrum of the etalon filter is relatively smaller, typically 0.7 GHz/° C.; accordingly, a large temperature change of several tenses of degree centigrade to obtain the change of 7 GHz for the etalon filter, which also prolongs the time to stabilize the temperature of the etalon filter.

Figure 6:
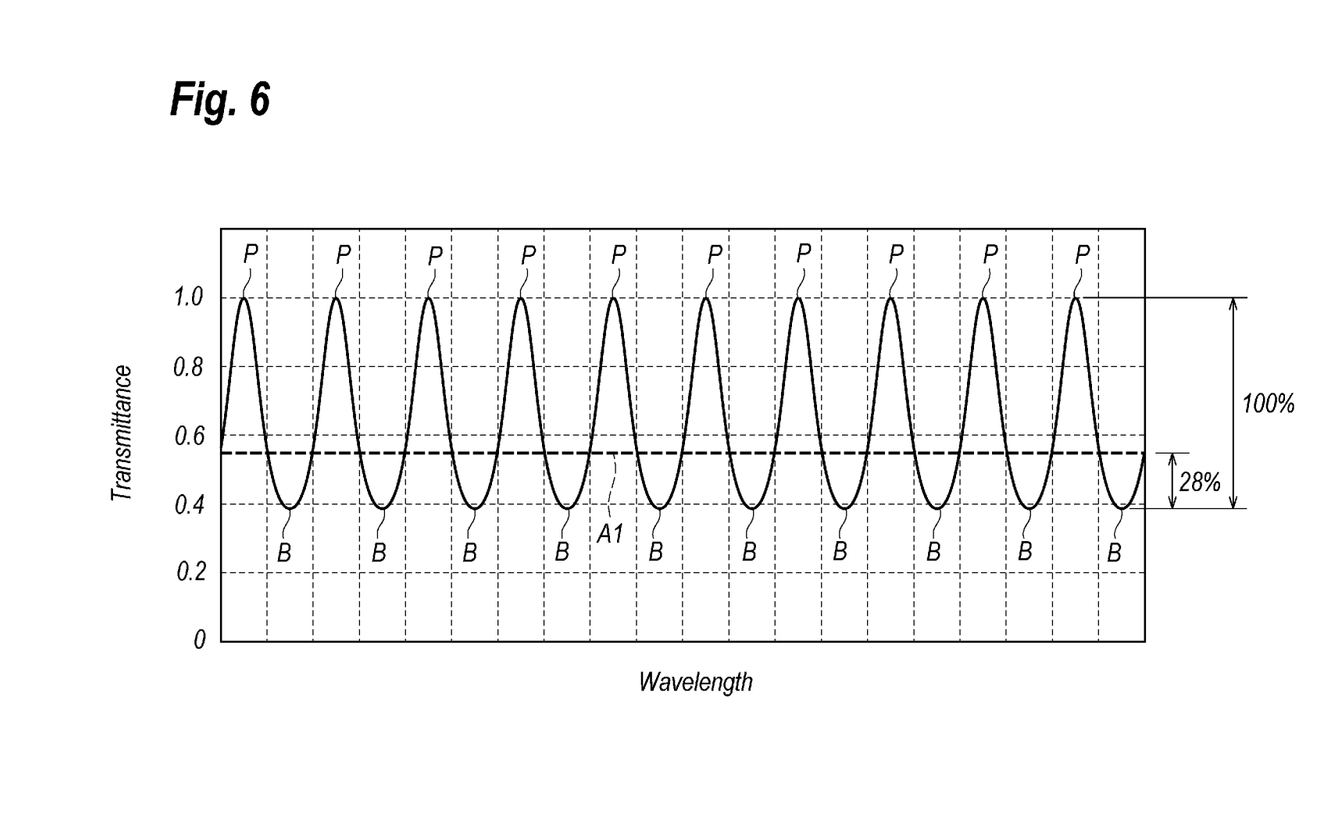
FIG. 6 shows a typical periodic transmission spectrum of an etalon filter.

FIG. 6 shows a typical transmission spectrum of an etalon filter, where the horizontal axis corresponds to a wavelength of light transmitter from the etalon filter, while, the vertical axis is the transmittance thereof. FIG. 6 assumes that the etalon filter under consideration has no absorption of light. As shown in FIG. 6, the transmission spectrum of the etalon filter inherently has a plurality of peaks P and bottoms B alternately appeared by a constant period. Assuming a target transmittance of the etalon filter as A1, which corresponds to an intensity of light transmitted through the etalon filter, wavelengths corresponding to the target transmittance A1 have a period to the neighbor wavelength coincident with the minimum period between the grid wavelengths. That is, one scale in FIG. 6 corresponds to the period of the grid wavelengths.

However, the first derivation of the transmission spectrum $\Delta t/\Delta \lambda$ of the etalon filter does not show the maximum at wavelengths corresponding to the target transmittance A1. That is, setting the height between the peak P and the bottom B to be 100%, the target transmittance A1 becomes about 28% measured from the bottom B. The maximum first derivation of the transmittance spectrum is obtained a greater than 50%, but the period to the next wavelength and that to the previous wavelength become different from others. Moreover, because the first derivation at the target transmittance becomes smaller, the loop gain to tune the emission wavelength finely also becomes smaller to degrade the accuracy of the tuned wavelength.

Figure 1:
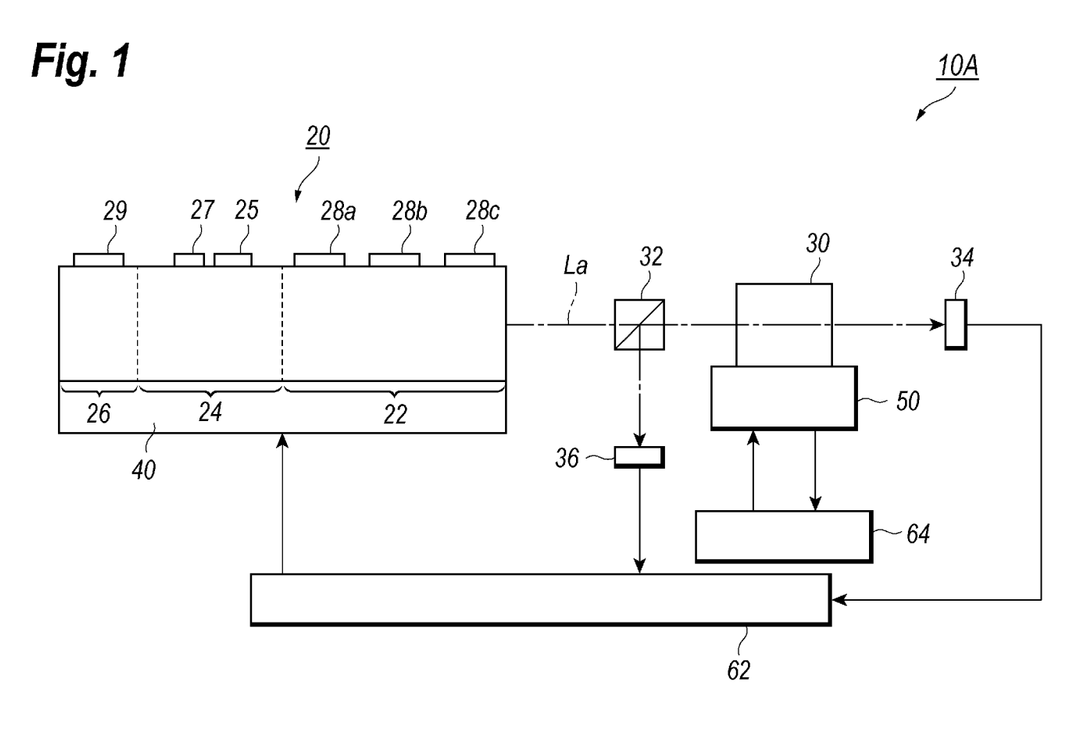
FIG. 1 shows a functional block diagram of a module of a wavelength tunable LD provided for a method according to an embodiment of the invention.

FIG. 1 schematically illustrates a module of a wavelength tunable LD 10A according to an embodiment of the invention. The module 10A includes an LD 20, an etalon filter 30, and a temperature controllers, 40 and 50, one of which places the LD 20 thereon, while, the other of which mounts the etalon filter 30 thereon.

The LD 20 is a type of wavelength tunable LD. The emission wavelength of the LD 20 is tunable, specifically, an emission wavelength may be selected by controlling a temperature thereof and/or a bias applied to electrodes of the LD 20. The temperature of the LD 20 is controlled by the temperature controller 40, which is a type of thermo-electric cooler (hereafter denoted as TEC) having a plurality of Peltier elements.

The LD 20 of the present embodiments provides three regions, 22 to 26; namely, a chirped sampled grating distributed Bragg reflector (hereafter denoted as CSG-DBR) 22, a sampled grating distributed feedback (hereafter denoted as SG-DFB) 24, and a semiconductor optical amplifier (hereafter denoted as SOA) 26. Former two regions, CSG-DBR 22 and SG-DFB 24, contribute to tune the emission wavelength.

The CSG-DBR 22 provides a waveguide containing a plurality of gratings each formed with a specific span, and shows a reflection spectrum with a plurality of peaks. A span of the reflection peaks is slightly different from a span of gain peaks attributed to the SG-DFB region 24. Then, the tunable LD 20 shown in FIG. 1A, emits light with the emission wavelength at which one of the reflection peaks of the CSG-DBR region 22 and one of the gain peaks of the SG-DFB region coincides with each other. The CSG-DBR region 22 provides tree heaters monolithically integrated therewith to vary refractive index of the waveguide by supplying biases to the heaters. The electrical power applied to the electrodes, 28a to 28c, varies the emission wavelength. An operating temperature of the tunable LD 20, which is controlled by the TEC 40 also varies the reflection spectrum of the CSG-DBR region 22.

The SG-DFB region 24 also includes a waveguide having a plurality of gratings each periodically formed with a specific span. The waveguide in the SG-DFB region 24 also provides a plurality of gain regions and tuning regions, where the former region varies the optical gain while the latter region varies the refractive index thereof and inherently shows a plurality of gain peaks each having a specific spam. The gain region of the SG-DFB region 24 provides an electrode 25 to inject carriers into the gain region, while, the tuning region includes another electrode 27 to inject carriers therein to modify the refractive index. The operating temperature of the tunable LD 20 also varies the gain spectrum of the tunable LD 20.

The SOA region 26 also provides a waveguide and an electrode 29. The optical gain of the SOA region 26 is varied by injecting carriers therein through the electrode 29. The waveguide in the CSG-DBR region 22, that in the SG-DFB region 24, and that in the SOA region 26 are optically coupled with each other.

The tunable LD 20 shown in FIG. 1 may tune the emission wavelength thereof by varying the power to the heaters in the CSG-DBR region 22 and the carriers injecting into the tuning region in the SG-DFB region 24 as setting the operating temperature thereof in constant. The tune of the emission wavelength of the LD 20 is promptly performed because the heaters are monolithically integrated therein, which shortens a time constant from the supplement of the power to the electrodes, 28a to 28c, to change of the operating temperature.

The etalon filter 30 in one surface thereof optically couples with one facet of the LD 20 by interposing a beam splitter 32. While, the other surface of the etalon filter 30 optically couples with a light-receiving device 34, typically, a semiconductor photodiode (hereafter denoted as PD). A portion of the optical beam La emitted from the facet of the LD 20 enters the PD 34 passing through the beam splitter 32 and the etalon filter 30. A portion of the optical beam La enters another PD 36 split by the beam splitter 32.

The PD 36 receives a portion of the light La directly from the LD 20 without passing the etalon filter 30. On the other hand, the other PD 34 receives a portion of the light La indirectly passing through the etalon filter 30. Thus, the intensity of the light received by the PD 32 reflects the periodic transmission spectrum of the etalon filter 30, while, the intensity of the light received by the other PD 34 reflects the intensity of the light directly output from the LD 20. Two intensity detected by respective PDs, 32 and 34, are provided to the temperature controller 62.

As described in FIG. 6, the etalon filter 30 inherently shows a periodic transmission spectrum. Moreover, the temperature controller 50 may vary a temperature of the etalon filter 30. The temperature controller is a type of, what we call, thermo-electric cooler (TEC) including Peltier elements.

The controller 62 estimates a current emission wavelength of the light La emitted from the LD 20 based on two intensities each provided from PDs, 34 and 36. Comparing the current wavelength of the light La with the target wavelength, feeding a difference between the current and the target wavelength back to the temperature controller 40, the controller 62 makes the current temperature close to the target temperature. The target wavelength is set within a wavelength range including one of grid wavelengths. The span of the grid wavelengths is, for instance, 50 GHz, namely about 0.4 nm in the wavelength space, while, the wavelength range is set to be, for instance, ±7 GHz, which corresponds to ±0.056 nm.

Another controller 64 decides a current temperature of the etalon filter 30 through an output of a temperature sensor which is placed on the temperature controller 50 and a type of thermistor. The controller 64 sets the current temperature of the etalon filter 30 in a target temperature by comparing thus provided current temperature of the etalon filter 30 with a target temperature. The transmittance of the etalon filter 30 depends on a temperature thereof. Specifically, the transmittance of the etalon filter 30 shifts toward a shorter wavelength, namely, a higher frequency as the temperature thereof decreases; while, it shifts toward a longer wavelength, namely, a lower frequency. The controller 64 preferably holds the target temperature. Moreover, the target temperature includes the first and second one, and details of them will be described later.

Figure 2:
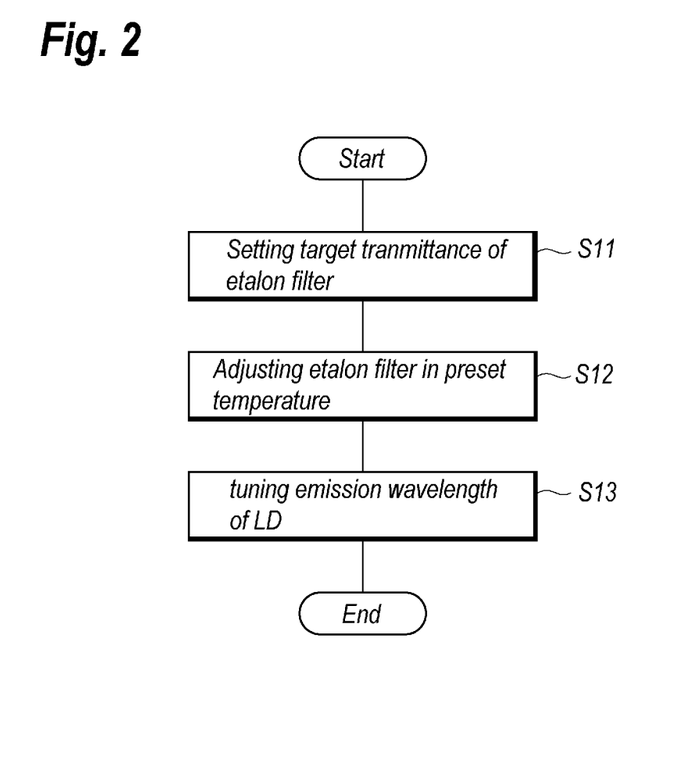
FIG. 2 is a flow chart of the method of one embodiment.

Next, a method to tune the emission wavelength of the LD will be described. FIG. 2 is a flow chart showing an algorithm of the tuning according to an embodiment of the invention. As shown in FIG. 2, the algorithm includes three steps, S11 to S13, namely, a step to set the transmittance S11, a step to control the temperature S12, and a step to tune the emission wavelength S13. The first step S11 sets the target transmittance of the etalon filter 30, namely, the intensity of the light detected by the PD 34. The second step S12 sets the temperature of the etalon filter 30 in one of the first and second one. The third step S13 sets, based on the intensity of the light La emitted from the LD and transmitted through the etalon filter 30, the emission wavelength of the LD 20 in a region including one of the first and second grid wavelengths, where the first and second grid wavelengths each constitutes the grid wavelengths with a constant period. The second step S12 is carried out by the controller 64, while, the third step S13 is carried out by the other controller 62.

In step S11, the transmittance of the etalon filter 30 at grid wavelengths, $\lambda 1$ and $\lambda 2$, is first measures and stored in the TEC driver 62. Step S11 may be carried out in a production of the the tunable LD module 10A. Further specifically, the emission wavelength of the tunable LD 20 is first set in one of the grid wavelengths $\lambda 1^{(i)}$ involved in one period of the transmittance spectrum of the etalon filter 30. Secondly, the temperature of the etalon filter 30 is adjusted such that the transmittance at the wavelength $\lambda 1$ relative to a height of the peak becomes greater than 40% but less than 50% measured from the bottom of the transmittance. Thirdly, the emission wavelength of the tunable LD 20 is set in another grid wavelength $\lambda 1^{(j)}$ involved in another period of the transmittance spectrum of the etalon filter 30, then, the temperature of the etalon filter 30 is adjusted such that the transmittance of the etalon filter at the grid wavelength $\lambda 1^{(j)}$ becomes greater than 40% but less than 50%. Iterating steps above described until the the transmittance of the etalon filter 30 becomes 40 to 50% at grid wavelengths of $\lambda 1^{(i)}$ and $\lambda 1^{(j)}$ under a temperature of the etalon filter 30 common to each other. This common temperature is stored in the TEC driver 64 as the first temperature T1. Finally, the transmittances of the etalon filter at optional grid wavelengths $\lambda 1^{(k)}$ are estimated by an interpolation or an extrapolation of two transmittances at respective grid wavelengths, $\lambda 1^{(i)}$ and $\lambda 1^{(j)}$.

The explanation above is for grid wavelengths at which the transmittance spectrum of the etalon filter 30 shows positive slopes. An evaluation of transmittances for grid wavelengths $\lambda 2^{(i)}$ at which the transmission spectrum of the etalon filter shows negative slopes is the same. Moreover, the grid wavelength $\lambda 1^{(i)}$ is preferably the shortest grid wavelength among wavelengths $\lambda 1^{(k)}$ and the grid wavelength $\lambda 1^{(j)}$ is preferably the longest one among wavelengths $\lambda 1^{(k)}$. The other types of the grid wavelengths $\lambda 2^{(k)}$ preferably have conditions same to those described above. That is, the grid wavelength $\lambda 2^{(i)}$ is preferably the shortest grid wavelength, while the other grid wavelength $\lambda 2^{(j)}$ is preferably the longest grid wavelength. Those conditions may enhance the accuracy of the transmittance of the etalon filter 30 by the interpolation and/or the extrapolation.

Figure 3:
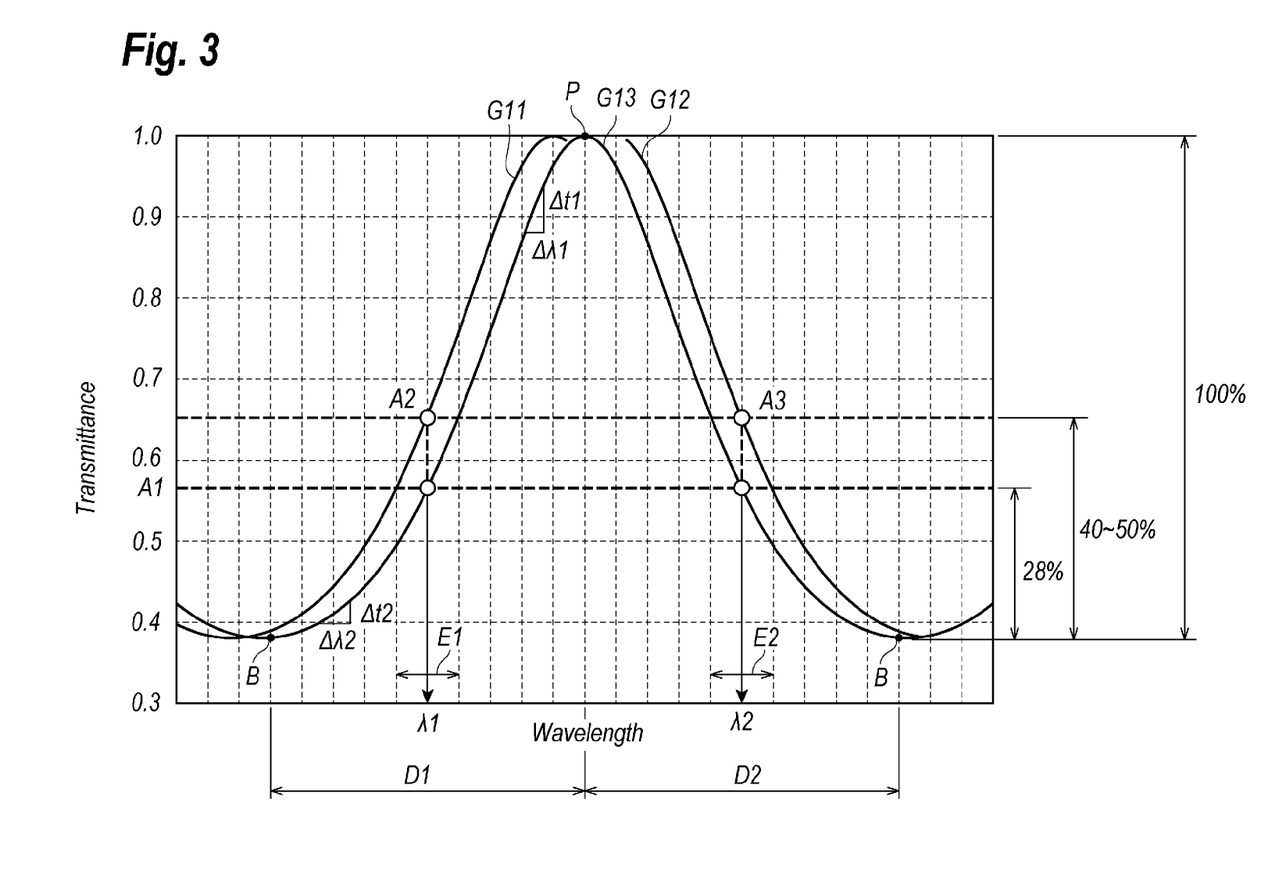
FIG. 3 magnifies one period of the periodic transmission spectrum of the etalon filter to explain the first and second grid wavelengths.

FIG. 3 magnifies the transmission spectrum of the etalon filter and describes a relation of the first grid wavelength and the second grid wavelength. The vertical axis of FIG. 3 corresponds the transmittance, while, the horizontal axis shows wavelengths. A behavior G11 in FIG. 3 indicates the transmittance of the etalon filter 30 at the first temperature T1, that G12 at the second temperature T2, and that G1 at a reference temperature T0. The reference temperature T0 corresponds to a temperature set at the etalon filter in a conventional method shown in FIG. 6. The first temperature T1 is higher than the reference temperature T0, while, the second temperature T2 is lower than the reference temperature T0.

As described, the transmittance of the etalon filter 30 provides a plurality of peaks P and bottoms B alternately appeared by a constant period. The conventional method sets the target transmittance of the light La transmitted through the etalon filter 30 in a point A1. Specifically, grid wavelengths, $\lambda 1, \lambda 2, \ldots$, at which the transmittance of the etalon filter 30 becomes A1, has the constant period, where $\lambda 1, \lambda 3, \ldots$ correspond to the transmittance with a positive slope, while $\lambda 2, \lambda 4, \ldots$ correspond to the transmittance with a negative slope.

However, as shown in FIG. 3, the transmittance of the etalon filter 30 inherently shows a vertical asymmetry, that is, a slope of the transmittance close to a peak, which is denoted by $\Delta t1/\Delta \lambda 1$ in FIG. 3, is greater than a slope thereof close to a bottom, which is denoted as $\Delta t2/\Delta \lambda 2$ in the figure. Accordingly, in order to set an even span for respective grid wavelengths, $\lambda 1, \lambda 2, \lambda 3, \ldots$; the target transmittance is necessary to be set around 28% assuming a height of the transmittance, namely, a peak Transmittance—a bottom transmittance, is 100%. However, the slope of the transmittance of the etalon filter 30 at a value of 28% becomes relatively smaller, which reduces the closed loop gain to tune the emission wavelength. The feedback control to tune the emission wavelength sometimes becomes unstable and degrades the accuracy of the emission wavelength.

The method according to the present embodiment, converse to the conventional algorithm described above, sets the temperature of the etalon filter 30 in one of the first temperature T1 (>T0) and the second one T2 (<T0) at step S12. When the emission wavelength of the optical beam La is to be controlled, at step S13, within a range E1 including the grid wavelength $\lambda 1$ where the transmittance shows a positive slope, the temperature of the etalon filter 30 is set in T1 at step S12 in advance to step S13. Then, the transmittance of the etalon filter 30 shifts toward a shorter wavelength compared with the transmittance G13 at the reference temperature T0, as shown in a behavior G11 in FIG. 3. On the other hand, when the emission wavelength is to be controlled in another range E2 including the grid wavelength $\lambda 2$, where the transmittance shows a negative slope, the temperature of the etalon filter 30 is set to be T2 at step S12, as shown in the behavior G12 in FIG. 3, which shifts the transmittance of the etalon filter 30 toward a longer wavelength. The ranges, E1 and E2, correspond to regions where the emission wavelength of the optical beam La is finely tuned, and preferably set to be about 20% of the span between grid wavelengths.

The grid wavelength $\lambda 1$ is involved in a range D1 of the transmittance of the etalon filter 30 where the transmittance shows a positive slope, that is, a range involved in a half period of the periodic transmittance spectrum of the etalon filter 30 in a shorter wavelength side with respect to a peak thereof. On the other hand, another grid wavelength $\lambda 1$ is involved in a range D2 with a half period of the periodic transmittance of the etalon filter 30 in a longer wavelength side with respect to the peak transmittance, where the transmittance shows a negative slope with respect to the wavelength.

Moreover, assuming the height of the periodic transmittance of the etalon filter to be equal to 100%, namely, a difference between the peak transmittance and the bottom transmittance, the first temperature T1 preferably sets the transmittance A2 of the etalon filter 30 at the grid wavelength $\lambda 1$ to be greater than 40%, further preferably to be greater than 40% but less than 50%. For second temperature T2, the transmittance A3 of the etalon filter 30 at the grid wavelength $\lambda 2$ preferably becomes greater than 40%, further preferably greater than 40% but less than 50%. Two transmittances, A2 and A3, may be equal to each other as shown in FIG. 3, or may be independently set in values different from others.

Subsequent to step S12 to set the temperature of the etalon filter 30 in one of the first temperature T1 and the second temperature T2, step S13 to tune the emission wavelength of the LD 20 is carried out. That is, when the temperature of the etalon filter 30 is set in T1, the emission wavelength of the tunable LD 20 is controlled in the range E1 including the grid wavelength $\lambda 2$. Oppositely, when the temperature of the etalon filter 30 is set in T2, the emission wavelength of the tunable LD 20 is controlled in the range E2 to be close to or equal to the grid wavelength $\lambda 2$. The tuning of the emission wavelength is carried out by controlling the temperature of the TEC 40 by the TEC driver 62.

According to an algorithm of the present embodiment thus described, different from the conventional method shown in FIG. 6, the transmittance spectrum of the etalon filter 30 is shifted such that the transmittance at the grid wavelengths, $\lambda 1$ and $\lambda 2$, becomes greater than 40%. As described, the etalon filter inherently shows the transmittance, exactly the slope of the transmittance, becomes greater at around midway between the peak P and the bottom B, namely, 50% of the peak height; while, the slope of the transmittance becomes moderate around the bottom B. Accordingly, shifting the transmission spectrum of the etalon filter 30, the slope of the transmittance at respective grid wavelengths, λ1 and λ2, becomes steeper, which increases the closed loop gain to tune the emission wavelength of the tunable LD 20, thus, the accuracy of the tuned emission wavelength enhances and the stability of the emission wavelength also enhances at the grid wavelength.

Moreover, the method according to the embodiment first sets the temperature of the etalon filter 30 at one of T1 and T2, and keeps the temperature thereof in constant during the wavelength tuning of the LD 20 by controlling the temperature of the LD 20, which shortens a time to tune the emission wavelength compare with a conventional method where the tuning is carried out by adjusting the temperature of the etalon filter 30.

The transmittance spectrum of the etalon filter 30 shows the maximum slope at a relative height of 54% measured from the bottom assuming the height, a difference between the peak transmittance and the bottom transmittance, is 100%. Accordingly, the maximum closed loop gain will be obtained to shift the transmittance spectrum of the etalon filter 30 such that the transmittance at the grid wavelengths, λ1 and λ2, becomes 54%. However, as the transmittance at the grid wavelengths increases, a difference between two temperatures, T1 and T2, at which the etalon filter 30 is set, becomes large, which takes longer time to shift the temperature. Moreover, the slope of the transmittance spectrum at the relative transmittance of 54% and that of 50% are not so large to affect the close loop gain of the wavelength tuning. Accordingly, setting the transmittance at the grid wavelengths, λ1 and λ2, to be preferably greater than 40% but less than 50%, the etalon filter 30 is rapidly set in the temperature thereof in one of T1 and T2, without failing the accuracy and the stability of the tuned wavelength.

Figure 4:
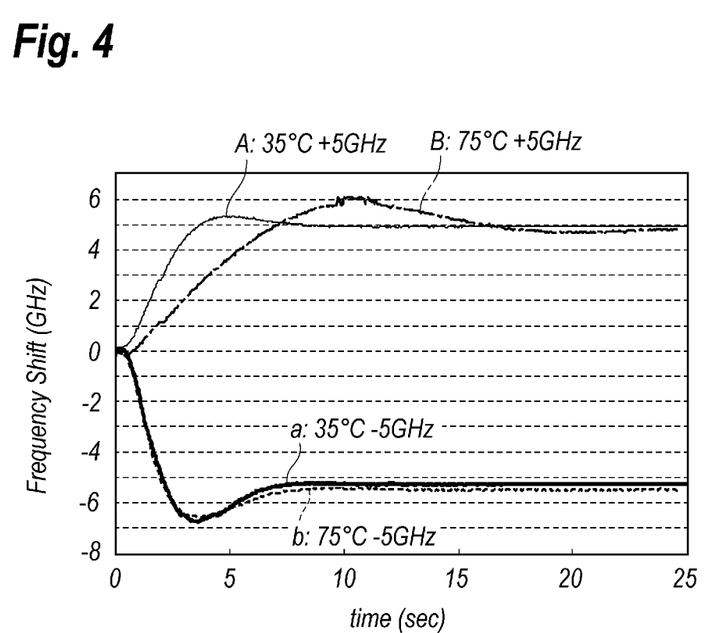
FIG. 4 shows convergences of the oscillation frequency, which is equivalent to the emission wavelength, of the wavelength tunable LD according a conventional algorithm.

FIG. 4 shows transitions of the oscillating frequency of a tunable LD according to conventional tuning method to vary a temperature of the etalon filter. Behaviors A and a correspond to cases where the center temperature of the etalon filter is set in 35° C.; while, behaviors B and b correspond to cases where the center temperature of the etalon filter is set in 75° C. Also, behaviors A and B shows transitions to shift the oscillating frequency by +5 GHz, while, behaviors a and b shows transitions to shift the oscillating frequency by −5 GHz. When the center temperature of the etalon filter 30 is set 35° C., it takes about 5 seconds until the oscillating frequency stabilizes at +5 GHz. However, when the center temperature of the etalon filter is raised to 75° C., a period longer than 15 seconds is necessary to stabilize the oscillating frequency.

Figure 5:
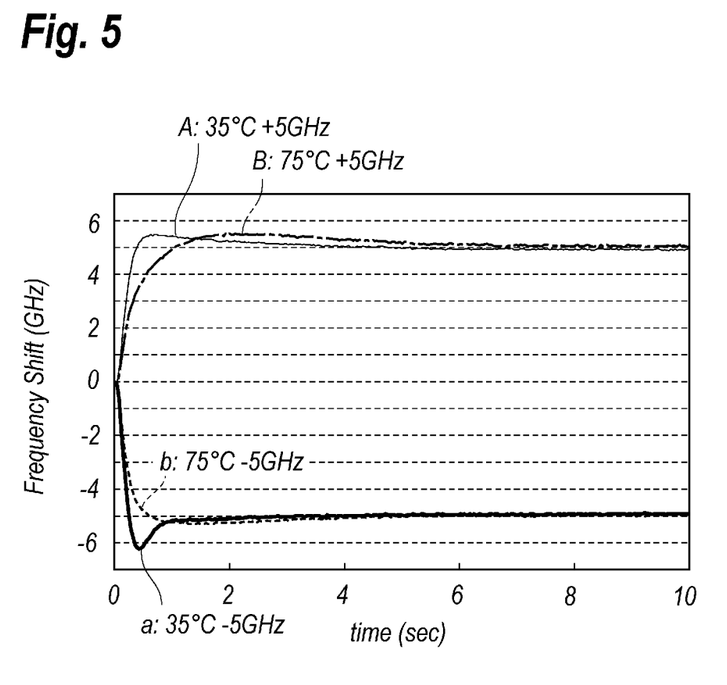
FIG. 5 shows convergences of the oscillation frequency of the wavelength tunable LD according to the algorithm of the embodiment of the invention.

FIG. 5 shows transitions of the oscillating frequency of a tunable LD when the oscillating frequency is finely tuned according to the present embodiment. Behaviors A to b in FIG. 5 have meanings same to those appeared in FIG. 4.

As clearly shown in FIG. 5, a period shorter than one (1) second is necessary to stabilize the oscillating frequency independent of the direction of the shift, that is, independent of a red shift or a blue shift, where the former shift corresponds to make the oscillating frequency smaller while the latter shift makes the frequency higher. Thus, the method to tune the emission wavelength according to the present embodiment drastically shortens a period to stabilize the emission wavelength at a new condition.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method to tune an emission wavelength of a wavelength tunable laser diode (LD) to a target grid wavelength by using an etalon filter showing a periodic transmission spectrum with a plurality of peaks and bottoms alternately appearing with a constant period, the periodic transmission spectrum of the etalon filter having a period between two peaks nearest to each other substantially twice of a span between two grid wavelengths nearest to each other, the method comprising steps of:
   determining a preset temperature of the etalon filter such that, as varying the temperature of the etalon filter, the transmittance of the etalon filter becomes greater than 40% relative to a height between a peak and a bottom at two grid wavelengths, wherein the transmission spectrum of the etalon filter has signs in a first derivation thereof same to each other at the two grid wavelengths;
   setting the etalon filter in the preset temperature such that the etalon filter shows a target transmittance greater than a reference transmittance by which the periodic transmission spectrum of the etalon filter shows a span substantially equal to a span between the two grid wavelengths neighbor to each other; and
   setting the wavelength tunable LD in a target temperature such that light emitted from the tunable LD and transmitted through the etalon filter shows the target transmittance.

2. The method of claim 1,
   wherein the target transmittance is greater than 40% relative to the height.

3. The method of claim 2,
   wherein the target transmittance is less than 50%.

4. The method of claim 1,
   wherein the transmittance of the etalon filter at a grid wavelength next to the target grid wavelength is lower than the target transmittance.

5. The method of claim 1,
   wherein the preset temperature is lower than a reference temperature where the transmittance of the etalon filter at the grid wavelength is substantially equal to a transmittance of the etalon filter at a next grid wavelength.

6. The method of claim 1,
   wherein one of two grid wavelengths is a shortest grid wavelength and another of the two grid wavelengths is a longest grid wavelength.

7. The method of claim 6,
   wherein the target wavelength of the etalon filter at the preset temperature is determined by an interpolation between the transmittance at the longest grid wavelength and the transmittance at the shortest grid wavelength.

* * * * *